(12) United States Patent
Sherstyuk et al.

(10) Patent No.: US 7,131,076 B2
(45) Date of Patent: Oct. 31, 2006

(54) METHOD OF INTERACTIVE VISUALIZATION AND PARAMETER SELECTION FOR ENGINEERING DESIGN

(75) Inventors: Nick Sherstyuk, Ottawa (CA); Dean Brotzel, Ottawa (CA)

(73) Assignee: Synopsys Inc., Mountain View, CA (US)

( * ) Notice: Subject to any disclaimer, the term of this patent is extended or adjusted under 35 U.S.C. 154(b) by 95 days.

(21) Appl. No.: 10/644,733

(22) Filed: Aug. 21, 2003

(65) Prior Publication Data
US 2004/0049744 A1    Mar. 11, 2004

Related U.S. Application Data

(60) Provisional application No. 60/404,766, filed on Aug. 21, 2002.

(51) Int. Cl.
G06F 17/50    (2006.01)
(52) U.S. Cl. .............................. 716/2; 716/4
(58) Field of Classification Search ............... 716/2, 716/4
See application file for complete search history.

(56) References Cited

U.S. PATENT DOCUMENTS

| | | | | |
|---|---|---|---|---|
| 5,999,714 | A * | 12/1999 | Conn et al. ..................... | 716/2 |
| 6,389,380 | B1 * | 5/2002 | Bankes ......................... | 703/17 |
| 6,530,065 | B1 * | 3/2003 | McDonald et al. ............. | 716/4 |
| 6,553,545 | B1 * | 4/2003 | Stinson et al. ................. | 716/4 |
| 6,560,568 | B1 * | 5/2003 | Singhal et al. ................. | 703/2 |
| 6,625,785 | B1 * | 9/2003 | Chatterjee et al. ............. | 716/4 |
| 6,851,097 | B1 * | 2/2005 | Zhang et al. ................... | 716/5 |
| 2003/0093250 | A1 * | 5/2003 | Goebel ........................... | 703/2 |
| 2003/0163295 | A1 * | 8/2003 | Jakatdar et al. ............... | 703/14 |
| 2003/0237059 | A1 * | 12/2003 | Schultz ........................... | 716/4 |
| 2004/0015793 | A1 * | 1/2004 | Saxena et al. .................. | 716/4 |
| 2005/0084987 | A1 * | 4/2005 | Wilson et al. .................. | 438/5 |
| 2005/0132306 | A1 * | 6/2005 | Smith et al. .................... | 716/1 |

OTHER PUBLICATIONS

Cao, Y. et al., "Design sensitivities to variability: extrapolations and assessments in nanometer vlsi", Sep. 25, 2002, IEEE, pp. 411-415.*
Antao, B, et al., "Behavioral simulation for analog system design verification", May 1994, IEEE, pp. 449-452.*
Williams, S, et al., "A new TCAD-based statistical methodology for the optimization and sensitivity analysis of semiconductor technologies", May 2000, IEEE, pp. 208-218.*

* cited by examiner

*Primary Examiner*—Stacy A Whitmore
(74) *Attorney, Agent, or Firm*—Bever, Hoffman & Harms, LLP; Jeanette S. Harms

(57) ABSTRACT

The present invention relates to a method of interactive visualization and parameter selection for engineering design. Initially, a nominal topology and associated design variables are set. The design variables are treated as being independent of each other for the purposes of a design variable sweep or sensitivity analysis to determine effects of changes in design variables on performance. The results of the sweep are presented to a designer, for example, by a suitable software tool including a graphical user interface. The designer selects design variables and revises their values based on the visually presented results of the sweep and effects a simulation using the revised values. If the results are satisfactory and a stopping condition is satisfied then the method is done. Otherwise, a determination must be made as to whether additional values can be changed or whether a new sweep must be effected. If a sweep is to be made, according the method of the present invention, an optional step is to change to topology prior to sweeping.

11 Claims, 15 Drawing Sheets

METHOD OF INTERACTIVE VISUALIZATION AND PARAMETER SELECTION FOR ENGINEERING DESIGN

CROSS-REFERENCE TO RELATED APPLICATIONS

The present application is related to and claims the benefit of convention priority from U.S. Provisional Patent Application No. 60/404,766 entitled "METHOD OF INTERACTIVE VISUALIZATION AND PARAMETER SELECTION FOR ENGINEERING DESIGN" filed on Aug. 21, 2002, the entirety of which is hereby incorporated by reference.

FIELD OF THE INVENTION

The present invention relates to engineering design and particularly to electronic design automation (EDA) including analog and mixed-signal circuits design.

BACKGROUND OF THE INVENTION

One important area of engineering design is circuit design. In circuit design, there are two main types of circuits: digital and analog circuits. The general aim of analog circuit design is to design an analog circuit with particular performance characteristics. In semiconductor analog circuit design, design of an analog circuit or subcircuit has two main steps: "front end design"—design of a circuit topology including device sizes, followed by "back end design"—design of a layout, for that topology. A topology is a set of devices (e.g. resistors), the devices' design variables (e.g. resistances), and how they are connected (e.g. wiring). A layout is a polygon-level description of a circuit that describes how the masks will be set ultimately "etched" during manufacturing.

Traditionally, both front end and back end analog design have been manual processes usually carried out by expert analog designers. The expertise of these designers is built up over years of experience; to become truly proficient a designer usually needs 10 years or more of training. This is because analog circuits have many characteristics that increase the difficulty of design, including nonlinear effects and the high sensitivity of the performance of the circuits to variations in manufacturing conditions and environmental conditions. The field of analog design has many heuristics to help overcome this sensitivity, such as heavy use of devices and groups of devices that "match" as well as use of symmetry.

Front end analog design has two sub-steps: topology design or topology selection, followed by device sizing. In back end analog design, there are three sub-steps: device generation, placement, and routing.

We now describe manual front end analog design. For a given design problem at hand, designers will typically try to find a topology that they think might meet performance goals. This is called "topology selection" and is usually relatively ad-hoc. Often, one topology will be tried; if it fails others will be tried. As an alternate to topology selection, or if no known topology can solve the design problem, then a new topology must be designed. In front end manual analog design, a topology is usually designed by a highly experienced designer or designers, and then is reused many times by analog designers at all levels of experience. An expert is needed because a strong understanding of analog circuit behavior is necessary.

Usually a new topology is designed using other topologies as starting points. Topology design is typically very time consuming—it is possible for a team of designers to spend six months working on a single topology. A topology is then "sized". Sizing involves changing the values of the design variables to change performance characteristics, until the designer is satisfied with the performance characteristics.

Designers typically start with some rough estimates of what the value of each design variable should be; they simulate that circuit and examine the performance characteristics. Then they tweak the values of the design variables, re-simulate, and re-examine the performance characteristics. Designers typically have to repeat this process of tweaking, simulating, and examining many times. This process of sizing can typically be very long as well: with each new application of the topology it can take many weeks or months for a design team to come up with device parameter values that satisfy the performance characteristic goals.

We now describe manual back end analog design. In device generation, each device is first converted to a set of polygon structures. The designer manually moves these structures about on a two-dimensional plane until the designer is satisfied ("placement"). Then the designer connects the placed devices via wires that are implemented as long snaking sets of rectangles ("routing"). Manual placement and routing of analog circuits can typically take on the order of a few days to weeks or even months.

Manual analog design has strengths and weaknesses. The greatest strength is that of promoting understanding, which has many benefits including: the designers end up with a very strong understanding of the behavior of the circuit they are designing; their design knowledge has been increased for future design work; they are in a better position to change that topology design in the future; if they encounter problems during the design cycle they are better-equipped to deal with them. Another strength is the flexibility of manual design as compared to automated design, because automated tools may not be programmed to be able to do everything that is required in a given design step.

The greatest weakness of manual analog design is that it is very slow. Also, to get ever higher quality designs takes ever longer. Another weakness is that many steps are tedious, such as the sizing process. Another weakness is that it takes a long time for designers to become truly proficient at analog design; therefore for all the time that they are not fully proficient the design time is even longer, or design quality is lower, than it would have been if they were fully proficient. A final weakness is that sometimes design rigor is not followed; for example, at the beginning of the design cycle designers may not explicitly state which specific circuit characteristics are targeted; because there is no clear time to stop designing, this lack of rigor leads to overdesign and longer design cycles, or to underdesign.

Automated analog circuit design aims to resolve the greatest weakness of manual design: that manual design is slow. There have been various approaches to each of the sub-steps in analog circuit design: topology design, topology selection, sizing, device generation, placement, and routing. Each of the various approaches has had its own respective degree of success (or lack thereof, depending on the case). Automated sizing is of particular interest because it is one area where there has been more success in automation.

A prevailing approach to automated sizing is as follows. In manual sizing the designer controls the design loop of "simulate circuit and examine performances, try new device parameter (design variable) values" which repeats until the designer is satisfied with the performance characteristics. In automated design, that same loop is controlled automatically; the designer or the computer may ultimately stop the repetition, depending on the implementation. There are various algorithms and heuristics to try new design variable values (e.g. simulated annealing or evolutionary algorithms). All the circuit performances have to be measured explicitly (e.g. how to measure power consumption), plus some means of specifying what the algorithm goals are based on those performances (e.g. "minimize" power consumption). A sizing process using this approach, including setup and post-run analysis, can typically reduce sizing times from months or weeks to days.

Automated analog design has strengths and weaknesses. The greatest strength is that design time can be greatly reduced. Also, design quality can be improved compared to what a manual design would be because the automated approach can examine a huge number of designs: performances could be higher, power could be lower, area could be lower, yield could be higher, resilience to manufacturing and environmental variations could be higher. Another strength is that design rigor is improved because all performance goals must be explicitly stated: the benefit is that the design's goals are always well documented, and the final designs are archived in a manner that explicitly states the resulting performance goals. A weakness of automated sizing is that it does not promote designer understanding; therefore all the benefits associated with designer understanding are not achieved. Also, the tools may not be as general and flexible as manual design. Also, because it does not promote designer understanding, adoption of such automated tools is slowed; designers are reluctant to use such tools because they want to maintain and build their understanding of circuits, e.g. so that they can properly do topology design.

In summary: manual analog design is slow but promotes designer understanding, whereas automated analog design is fast but does not promote designer understanding.

Accordingly, it is desirable to provide a method of design applicable to front end analog design which is faster than manual design and promotes designer understanding better than automated analog design.

It is also desirable to provide a method of design which enables a designer to apply the insights from the method for semi-automated design to improve the efficiency of automated design.

SUMMARY OF THE INVENTION

The present invention relates a improved method of interactively determining values of design variables for engineering design. For example, in the realm of circuit design, the present invention relates to helping a designer obtain optimal circuits and providing the designer insight into the complicated interactions between circuit metrics (characteristics of the circuit of concern to the designer) and circuit design variables. These metric, design variable interactions will hereinafter be referred to as "the problem domain".

It is a goal to provide a method of engineering design which overcomes or mitigates one or more of the difficulties of the known art.

It is a goal of the present invention to provide an approach for front end analog design that is faster than manual design and promotes designer understanding better than automated analog design. Therefore this invention "sits between" manual and automatic design, i.e. is a method for semi-automated design. When implemented as a software tool, the present invention complements tools for manual design and tools for automated design. The present invention combines the best aspects of both manual and automated design and is applicable to analog topology design and to analog sizing, as well as other areas of engineering design.

It is a further goal of the present invention to apply the insights from the method for semi-automated design to improve the efficiency of automated design. This invention achieves its results through the sequential sweeping of design variables (starting from a nominal circuit). The invention allows construction of optimal circuits and provides insight into the problem domain by proceeding based on the assumption that each metric varies independently with each design variable. Stated another way each metric can be modified by adjusting a design variable without caring how the other design variables are adjusted.

The invention allows the designer to gain insight into the problem domain by enabling the designer to visualize the metric dependencies on any design variable. This allows the designer to visualize the tradeoffs of multiple metrics through a design variable and allows the identification of the design variables which are important in the modification of a specified metric. By giving the designer insight into the problem domain the designer may be able to optimize some or all of the important metrics or the circuit. This manual optimization involves an entire sweep of the design variables (also referred to as a "sensitivity analysis") and the designer's investigating tradeoffs and altering design variables to improve important metrics of the circuit. The process of conducting a conducting a design variable sweep and investigating tradeoffs is done one or more times as required.

By assuming that the metrics depend separately on the design variables the designer may alter multiple design variables before having to perform another design variable sweep which can be expensive in terms of resources. In reality there is some interdependence between a metric and all design variables and thus the number of design variables that can be altered before doing another design variable sweep must be done, is limited in practice. The designer can check the deviation of theory from practice by running a simulation on the circuit to see how close the predicted values of the design variable sweep are to the simulation results. When the deviation is too great, a new design variable sweep must be done and the entire process repeated. Advantageously, this approach means that multiple design variables can be altered at once before having to a complete another design variable sweep, which is required every time a design variable is altered if there is no assumption of independence between metrics and design variables.

The present invention enables the creation of optimal circuits through two different methods. The first method involves the automation of the manual method mentioned above. The second method takes advantage of the metric interdependence on design variables by sweeping each design variable independently. Another important feature of the invention is that it enables the sweeping of design variables independently to allow the discovery of optimal circuits quickly and in a way that scales linearly with the number of design variables used in the circuit.

FIG. 14 illustrates graphically a comparison of the present invention with known methods. A traditional manual approach 1401 and an automated optimization approach 1403 lie on the same previous tradeoff curve 1404. The present approach 1402 provides superior understanding than the traditional manual approach 1401 while lying on a tradeoff curve 1405 which includes the automated optimization approach 1403.

The core insight of the present invention is: the coupling of design parameters is less tight than one might expect. We take an extreme view and say "let's pretend that the parameters aren't coupled at all, and just change parameters one at a time, and see how well we can design that way." Even though this extreme view is not 100% accurate in general, it turns out to be effective for design. We call this the "decoupling insight".

We leverage this insight with the following method, which at its core includes the following steps: sampling; then a loop of visualization and design variable value selection; re-loop back to sampling as necessary. Assume we start with a design with an initial set of values of design variables, with the goal to change the values to improve design performance or quality. Sampling proceeds as follows: for each design variable, sweep across the possible values of the design variable while holding the other design variables constant their initial values; at each point in the sweep simulate and record the metrics (or performance characteristics) of the design. Alternatively, the sweep can be across a subset of the possible values of the selected design variable if certain values are known to be undesirable or if resources are limited.

FIG. 15 illustrates the results of a variable sweep of a selected design variable with respect to a particular metric. Additional sweeps will be required corresponding with the other metrics. The initial nominal value of the variable is given at 1503. The sweep is conducted over the range of values of the design variable denoted by 1501 to 1506. This can, for example, represent the physical limits of a component or constraints otherwise imposed on the design variable. With respect to the particular metric being investigated we note that setting the selected design variable to the value denoted by 1505 gives a maximum value of the metric being investigated. Comparing this metric value with the metric value at the nominal selected design variable value provides us with the amount of improvement possible to that metric by changing the selected design variable. Note that the region between the points denoted by 1503 and 1504 correspond with a set of minimum values and if this is known beforehand (for example by previous experience) then the sweep can be conducted on a subset of the range namely, the union of the values between the points represented by 1501 and 1503 and the values between the points represented by 1504 and 1506.

Visualization and selection proceed as follows: the designer interactively browses plots of each metric as a function of each design variable, and selects new values for one or more design variables. This sampling followed by visualization and selection can be repeated until some termination criterion is met. We call this method the "one dimensional sweep semi-automated method."

The reason we can usefully change more than one design variable after sampling is due to what we call the "planarity insight." It turns out that when design parameters are coupled, they tend to affect the performances in a linear coupling for localized regions. That is, in a local region, the performance function of coupled design variables is fairly planar. This means that if the designer samples then changes one design variable, the designer need not immediately resample everything because the information that relates the other design variables to relative changes in performances tends to remain relatively accurate. It might be proportionally higher or lower, but it is still useful. Typically at least a few design variables can be changed until the accuracy of the relative changes degrades past usability.

The design speed of this method is comparable to automated sizing. Just like automated sizing, this approach's measures for performance characteristics need to be set up beforehand. The time taken for the sampling aspect of this invention is only limited by how fast the performance characteristics of designs can be automatically evaluated, i.e. computational power. In front end analog circuit design this translates to computer speed, simulator speed, and number of computers. At worst, this takes on the order of magnitude of hours. It is all automatic as well, so it can be done overnight. The loop of visualization and design variable value selection can often take as little as ten minutes to get very good results. Typically, just one iteration of sampling is enough to achieve good results. Thus, this approach takes roughly the same amount of time as automated sizing.

We examine the circuit understanding gained from using this method and find that it is greatly improved over automated sizing, and in many ways is comparable to manual sizing. It shows the relation between each design variable and each metric, which is the critical information for the analog designer. It gives the designer an understanding of the important design variables, and their effects. It does it visually so that the information can be learned quickly. And because it gives the designer these relationships and the designer knows the relation between the circuit topology and design variables, then the designer's understanding of the topology's functioning is improved. (In automated sizing that critical link between topology and design variables is weakened because the designer is less involved with specific design variables.) One might argue that since it presents more information about design variables and their relation to metrics or performance characteristics than the designer might otherwise be aware of, then it could conceivably provide more understanding than pure manual design. Of course, there are other aspects of understanding that would still be the realm of manual design, such as simplified equations to relate the design variables to performance. Accordingly, the semi-automated design method of the present invention combines the speed of automated sizing with the understanding of manual sizing.

As mentioned in the background section, it is a secondary goal of the present invention to apply the techniques from the method for semi-automated design to improve the efficiency of automated analog sizing techniques. As already stated, a core insight is that we can proceed on the assumption that the design variables are not coupled. This insight can be developed into a simple algorithm. For example, a basic version of the algorithm is: cycle through the design variables one at a time trying all possible values of the variable, always keeping the best design so far as it goes. This algorithm is applicable to analog circuit sizing and will be described more fully in the detailed description.

According to an aspect of the present invention there is provided a method of interactively determining values of design variables for an engineering design, the engineering design having a structure, design variables associated with the structure and metrics for evaluating the performance of the design, the method comprising: assigning initial values to the design variables; conducting a simulation of the design to determine values of the metrics of the design based on the initial values of the design variables; identifying metrics which a designer desires to improve; conducting a sensitivity analysis by varying each design variable in turn over a range of values for the design variable to determine effects of changes in design variables on the metrics; selecting one or more design variables whose values are to be changed based on the results of the sensitivity analysis; and changing the value of the selected design variables based on the results of the sensitivity analysis.

BRIEF DESCRIPTION OF THE DRAWINGS

Embodiments of the present invention will now be described, by way of example only, with reference to the attached Figures, wherein.

DETAILED DESCRIPTION

The present invention relates to a method of interactive visualization and parameter selection for engineering design.

It is an aspect of the present invention to apply the techniques from the method for semi-automated design to improve the efficiency of automated analog sizing techniques. A core insight is that we can proceed as if design parameters are not coupled. This insight can be developed into a simple algorithm, which cycles through the design parameters one at a time trying all possible values of the parameter, always keeping the best design so far as it goes.

The algorithm proceeds as follows:

Given an initial set of design parameters Init_params:

Best_design=Init_params

Repeat the following until termination criteria hit:
   For each design parameter p,
     For each possible value v of p,
       Candidate_design=Best_design but altered to have v at p
       Evaluate performance characteristics of Candidate_design
       If Candidate_design is better than Best_Design:
          Set Best_design=Candidate Design Return Best_design Termination criteria can include: the designer or algorithm is satisfied with design quality; runtime has been exceeded; improvement of performance characteristics has slowed or stagnated; and others. To compute if one design is "better" than another design, a common technique is a function to convert the performance characteristics into a scalar value, then simply selecting the design with the best scalar value.

Although this algorithm is simple, it is not obvious that it would be useful in a design problem such as analog circuit design, because the assumption there is that the design variables are so coupled. This algorithm can be extended to improve its effectiveness. One extension is to eliminate from consideration design variables with little or no effect once all design variables have been examined or swept.

Another extension is to maintain a list of "nondominated designs." A dominated design is a design that is worse in all performance characteristics, than at least one other design already examined. Correspondingly, a nondominated design is one that is not worse in all performance characteristics than any other designs already examined. That is, each nondominated design is good in its own ways; there is no other design that is completely better. Thus, during the run of the algorithm and after termination, the designer has access to this list of designs in which each design is good in its own ways.

Figure 1:
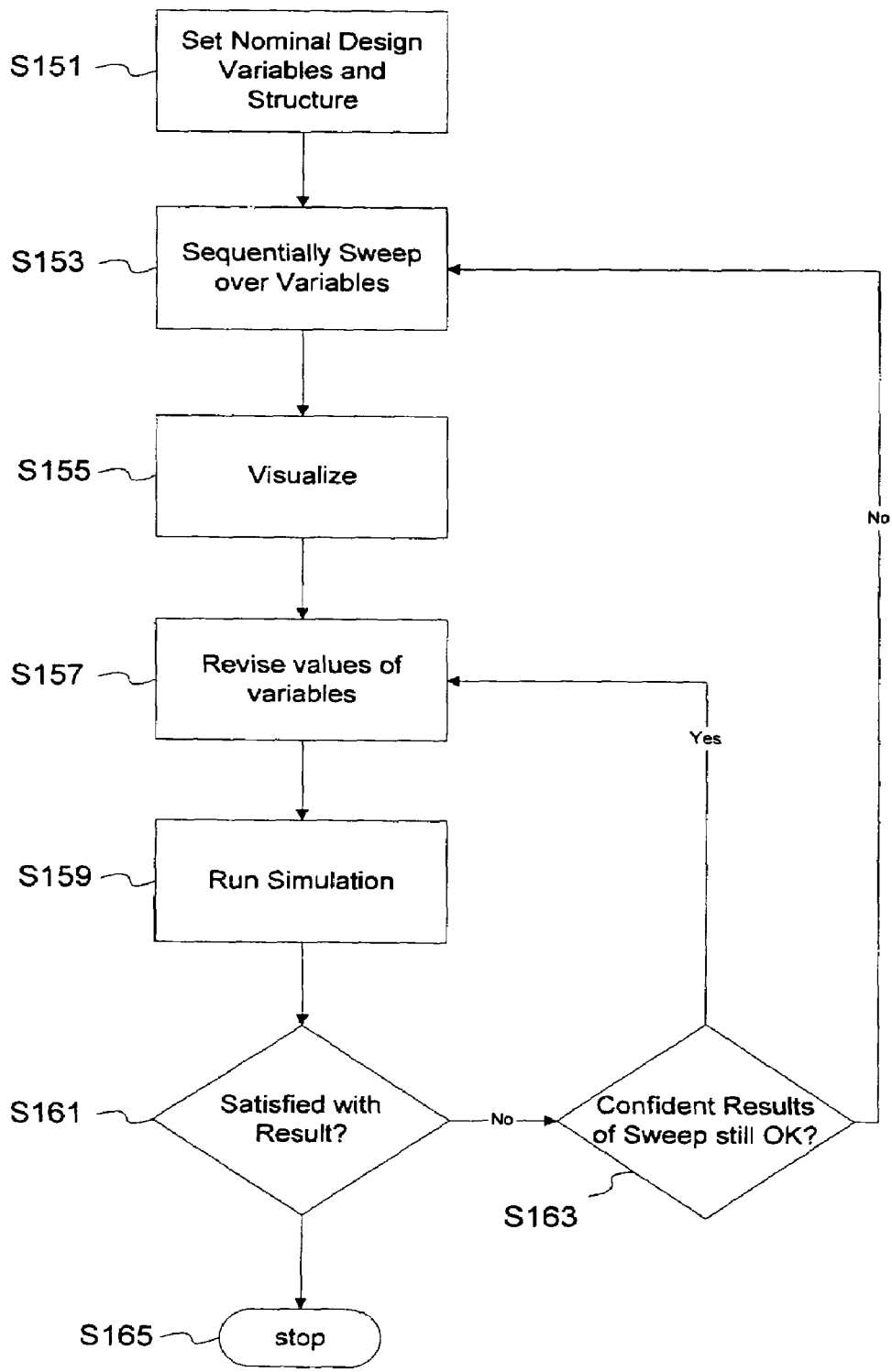
FIG. 1 illustrates an example method in accordance with an aspect of the present invention.

Referring to FIG. 1, according to an embodiment of the present invention, a method of interactive visualization and parameter selection for engineering design begins initially by selecting a nominal topology and associated design variables (see step s151). The design variables are treated as being independent of each other for the purposes of a design variable sweep (see step s153) or sensitivity analysis to determine effects of changes in design variables on performance. The results of the sweep are presented to a designer, for example, visually presented by a suitable software tool including a graphical user interface (see step s155). The designer revises the values of select design variables based on the visually presented results of the sweep (see step s157) and effects a simulation using the revised values (see step s159). If the results are satisfactory and meet a stopping condition then the method is done (see steps s161, s165). Otherwise, a determination must be made as to whether additional values can be changed or whether a new sweep must be effected (see step s163).

Figure 2:
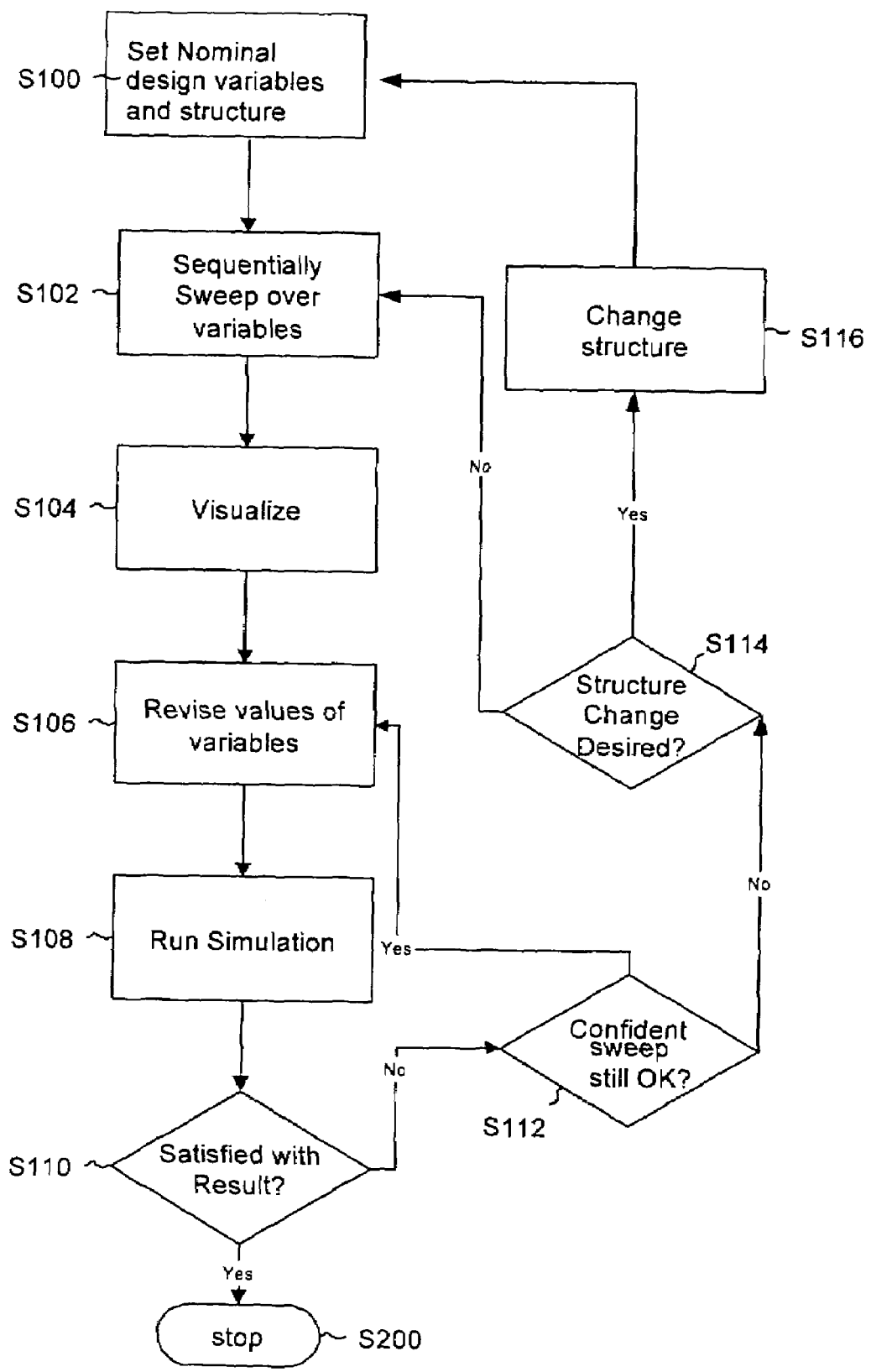
FIG. 2 illustrates a another alternative embodiment of the present invention.

Referring to FIG. 2, note that the present method extends the method beyond design problems that include just design parameters, to problems that include more than parameters, e.g. extending from analog circuit sizing to analog topology design. This is possible because the method preserves and builds understanding of the design. This understanding can be leveraged in manual design outside the scope of parameters because the designer has more information to make good decisions about non-parameter changes. For example, if a designer is aware of a design variable that have a critical effect on the performance of a topology and understands how other design variables nearby on the topology affect performance, then the designer is able to make a topological change to aid the component that contains that critical design parameter, e.g. add a transistor nearby with a certain length, width, etc. To handle such an extension, the semi-automatic parameter design method previously described becomes the inner loop. The steps include: semi-automatic sizing; stop if successful; otherwise, change topology and repeat. FIG. 2 presents a method similar to the method of FIG. 1 with additional steps s114, s116 so that structural changes are available. Specifically, if a sweep is needed (step s112 answer is "no") then an optional step is to change to structure (such as topology) prior to sweeping (see steps s114, s116).

Figure 3:
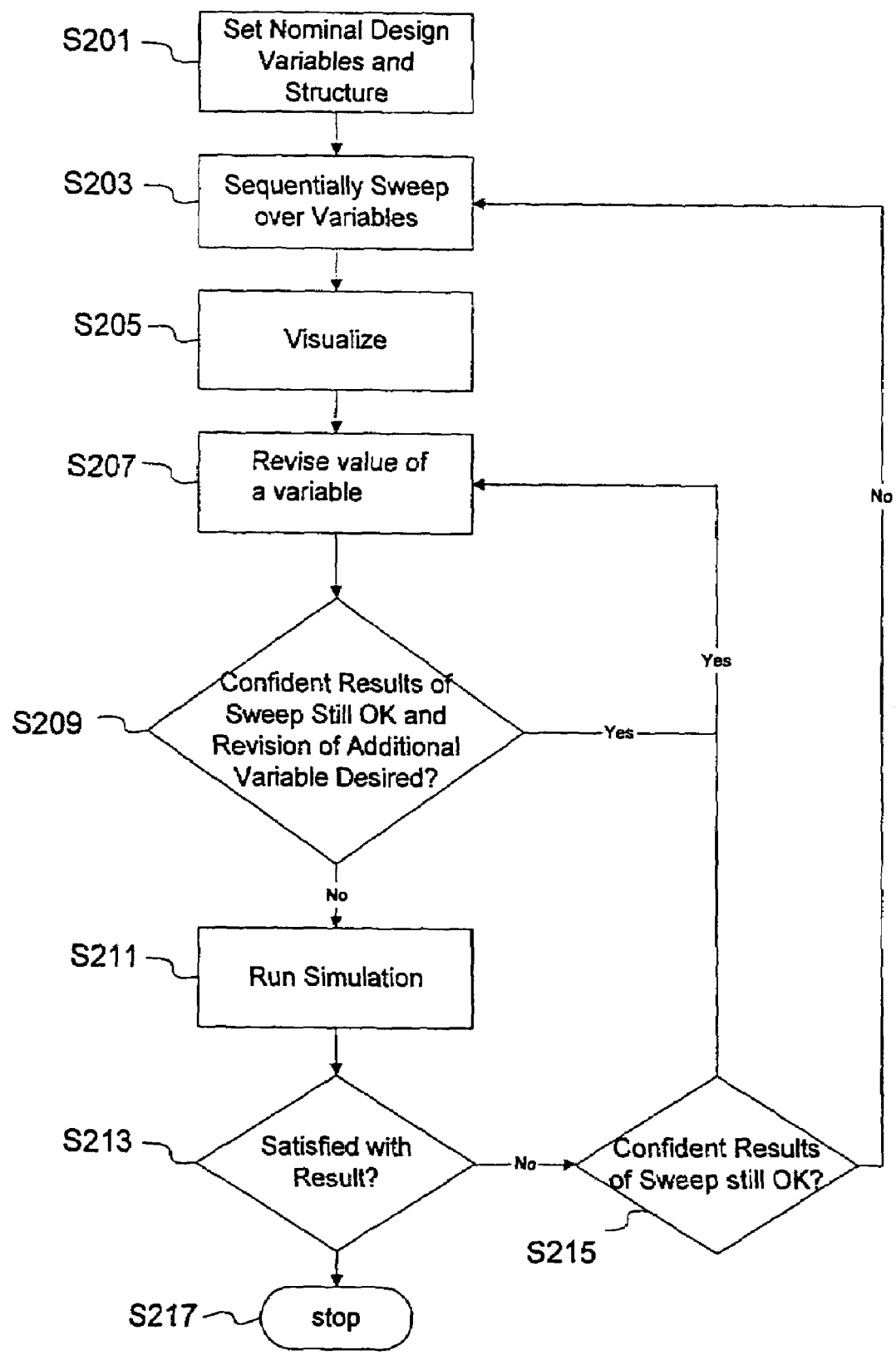
FIG. 3 illustrates a further embodiment of the present invention.

Referring to FIG. 3, a further variation occurs in that step s157 of FIG. 1 is replaced by steps s207 and s209. The difference is that at step s207 only a single design variable is changed before a determination is made at step s209 whether to continue with further design variable changes (s207) or to run an additional simulation (step s211).

Referring to FIGS. 4 to 13, we illustrate the present invention in the context of an example in which we wish to improve the performance of a programmable op amp. The initial circuit gives us performance which is acceptable, but some metrics can be improved. Each metric has a normalized (positive) score. The overall performance of the circuit can, for example, be represented by a weighted sum of individual scores.

Figure 4:
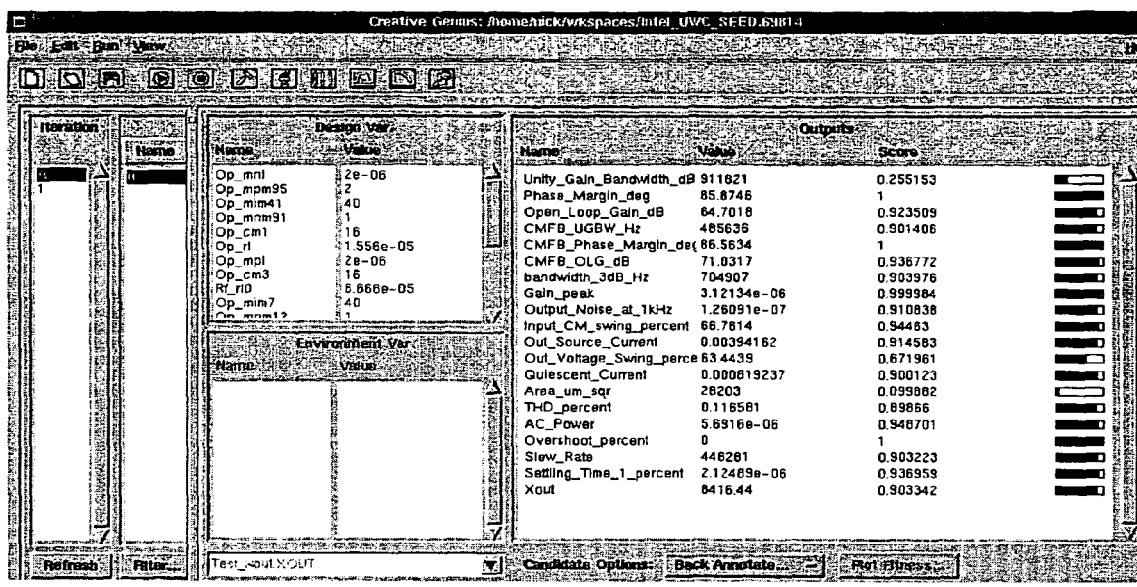
FIGS. 4 to 13 are a sequence of screen captures illustrating an example embodiment of the present invention as a software tool having a graphical interface.

FIG. 4 shows the screen with results of analysis for an initial circuit. Based on the results presented on screen a decision (based on judgement or some predetermined selection criterion based on score) is made to focus on the following metrics:

(1) Out_Voltage_Swing_Percent;
(2) Unity_Gain_Bandwith_dB; and
(3) Area.

FIG. 4 shows that the metric Unity_Gain_Bandwith_3 dB has a score of 0.255; the metric Out_Voltage_Swing_percent has a score of 0.67; and the metric Area has a score of 0.0998.

After performing a sweep of the design variables, we can choose which parameter we want to improve and all design variables will be sorted according to score. The design variable sweep is conducted by for each design variable by varying the design variable over its range of values while keeping the remaining design variables constant. In this way the corresponding metrics are determined and the maximum value of the metric over the range of sensitivity analysis is determined. The result is compared to the nominal value.

Figure 7:
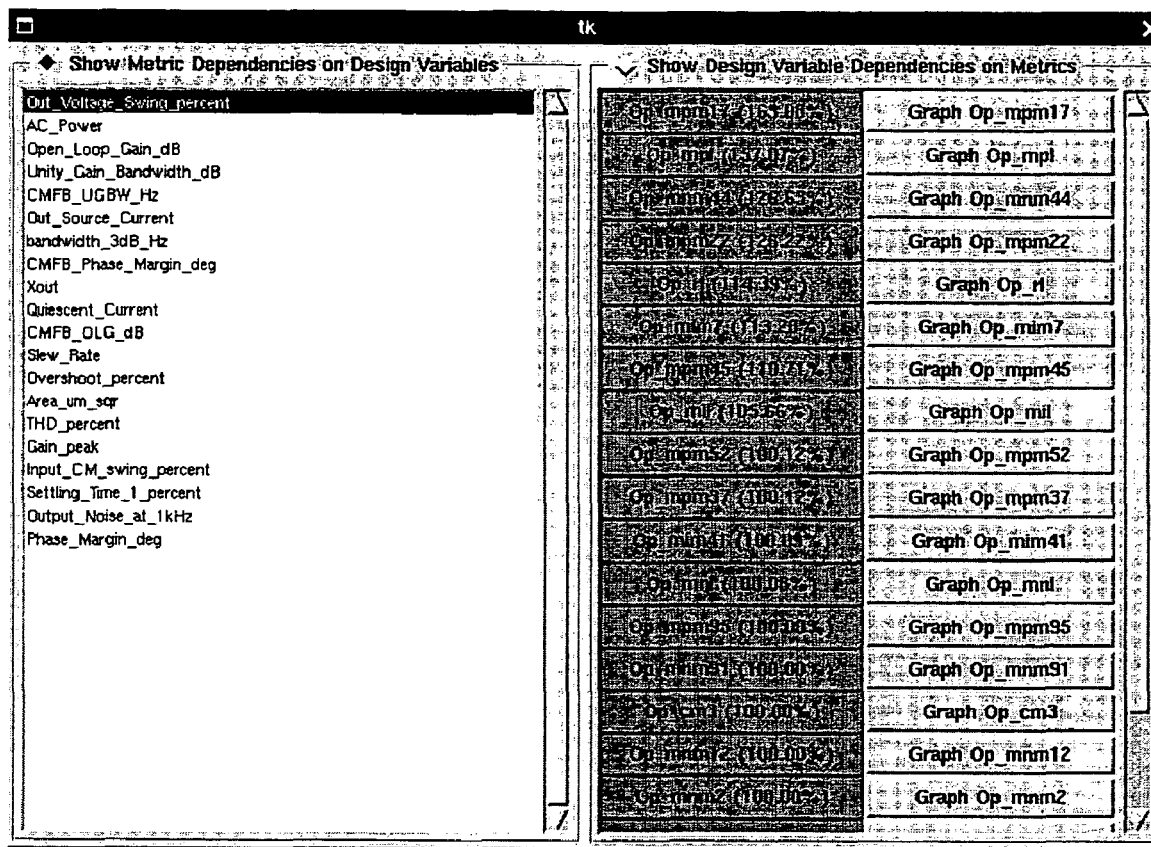

As a first candidate, we choose the metric Out_Voltage_Swing_Percent to be improved. Referring to FIG. 7, it is apparent that design variable Op_mpm17 gives 63% improvement to the metric Out_Voltage_Swing_Percent compared to the initial point and Op_mpl gives 57% of improvement.

Figure 9:
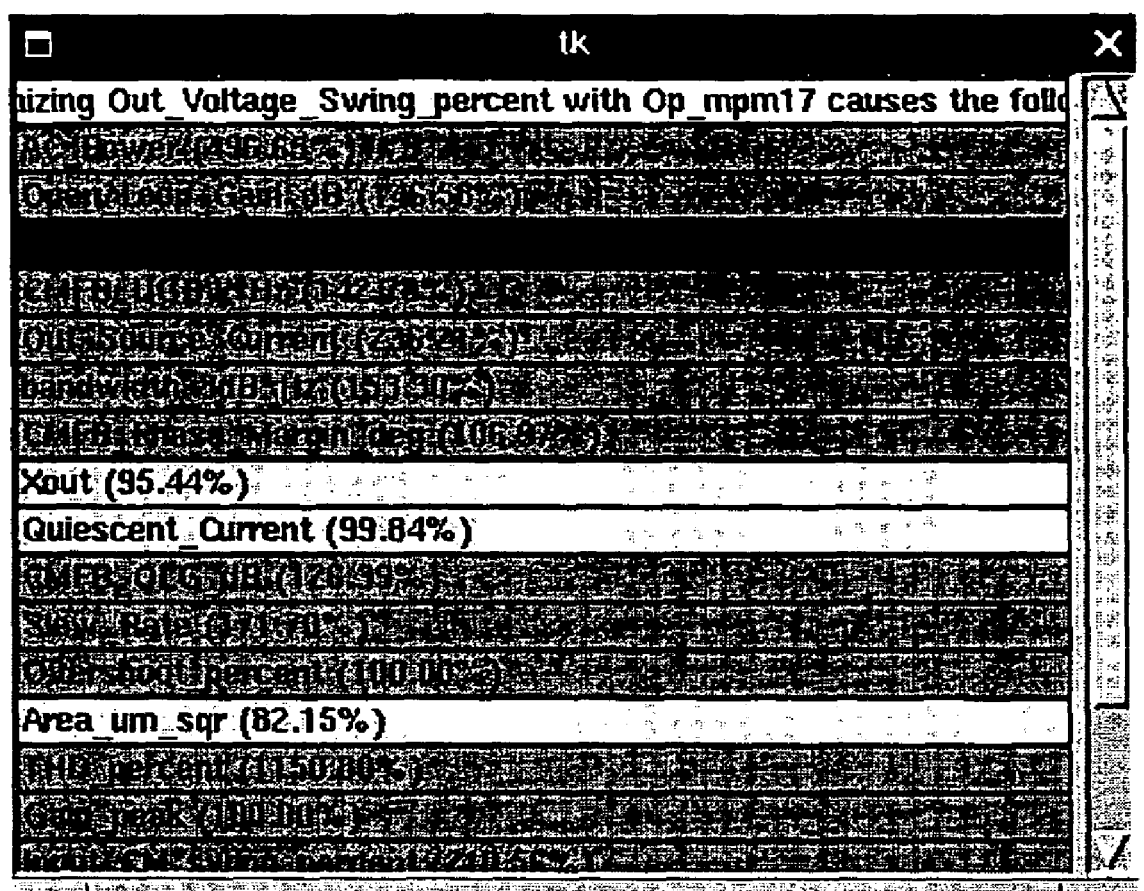

FIG. 9 illustrates another screen enabling the designer to check how potentially dangerous or successful this change of value for design variable Op_mpm17 is to other metrics of the circuit. It is apparent that the metric Unity_Gain_Bandwith_3 dB goes to zero (emphasized in red in the original software). Additional lines (in different colours in the original software) indicate that there is a price to pay for the improvement of the metric Out_Voltage_Swing_Percent (since they have been reduced below 100%).

Figure 8:
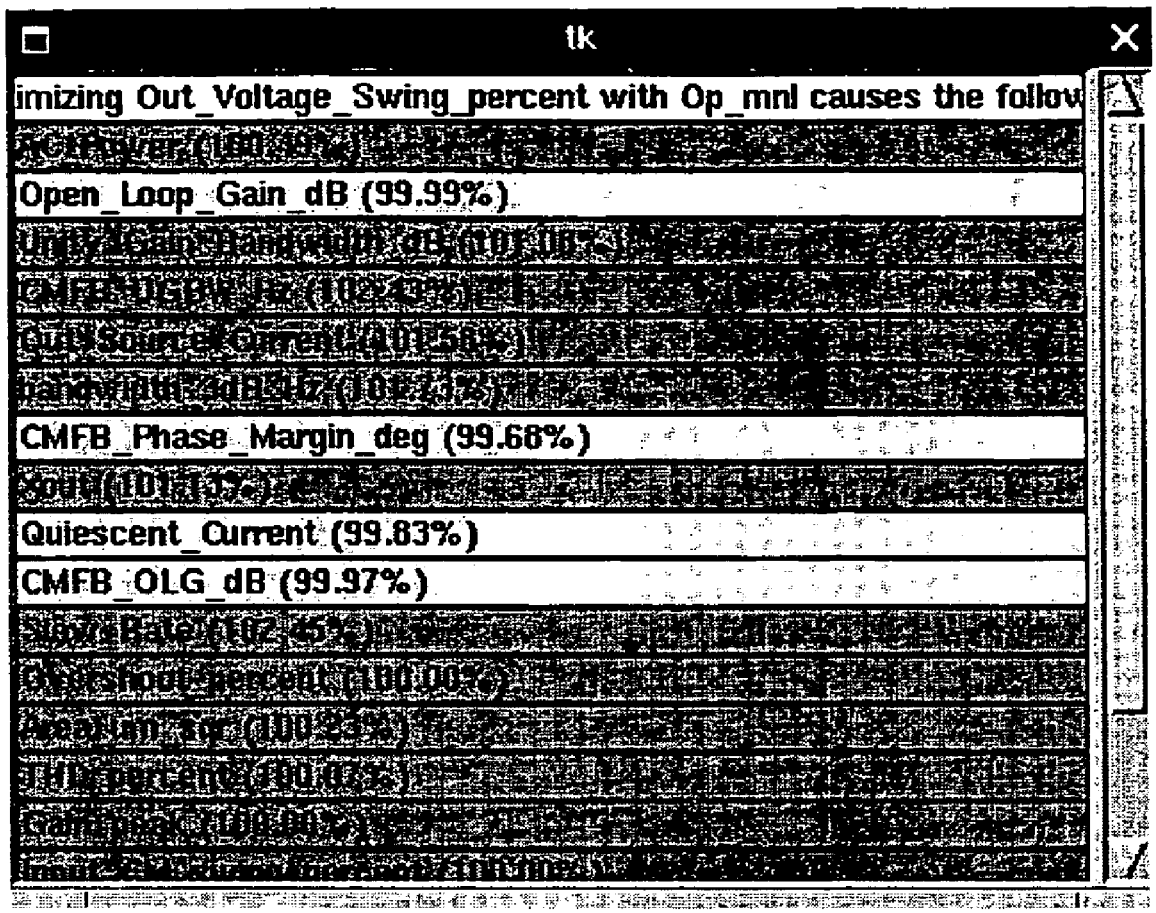

FIG. 8 is an image of another screen which enables the designer to see how potentially dangerous or successful is the change for the design variable Op_mpl to other metrics of the circuit. No zero valued lines (red in the original software) appear, so, this design variable is more promising and we can continue.

Figure 10:
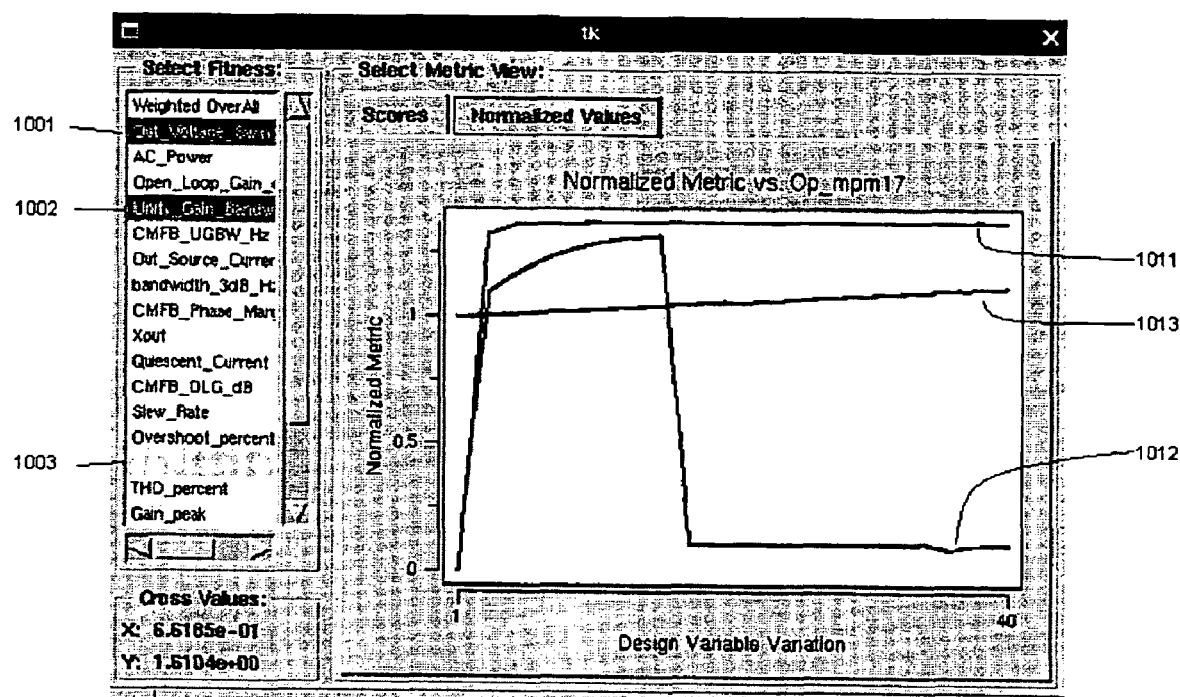

FIG. 10 shows the relations between the design variable Op_mpm17 and the metrics 1001, 1002 and 1003 which we wish to improve. The current value spot (nominal values) is the triple intersection of the lines 1011, 1012 and 1013 corresponding respectively with metrics 1001, 1002 and 1003. The value of design variable Op_mpm17 can be changed from nominal value 2 to 10 to improve two major metrics with a minor (acceptable) setback relating to the metric Area.

Figure 11:
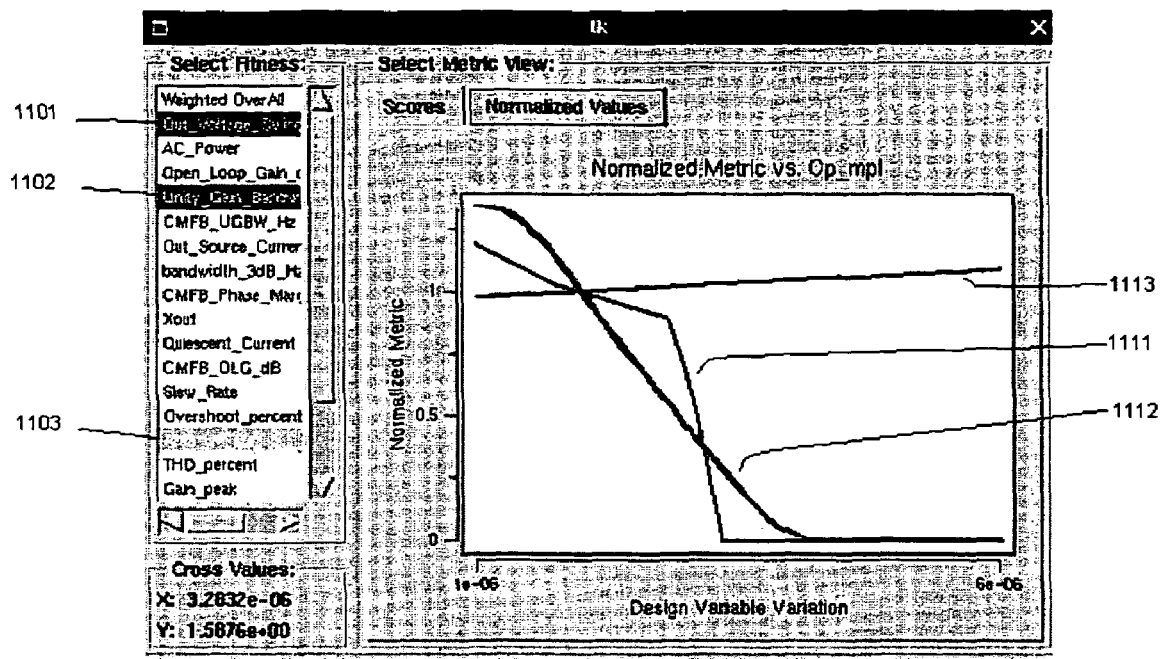

FIG. 11 shows the relations between the design variable Op_mpl and the metrics 1101, 1102, 1103 we are interested in improving. We can realize additional benefits here. Again the initial nominal value is represented at the triple intersection of the lines 1111, 1112 and 1113 which correspond respectively with metrics 1101, 1102 and 1103.

Figure 12:
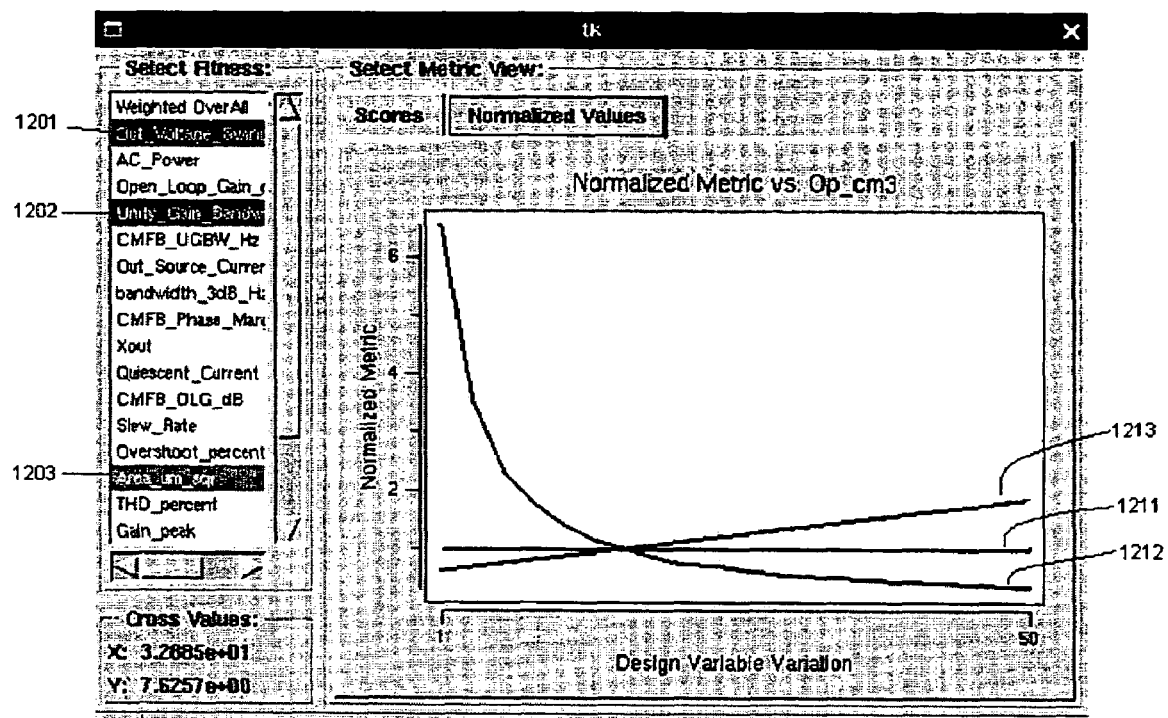
Figure 13:
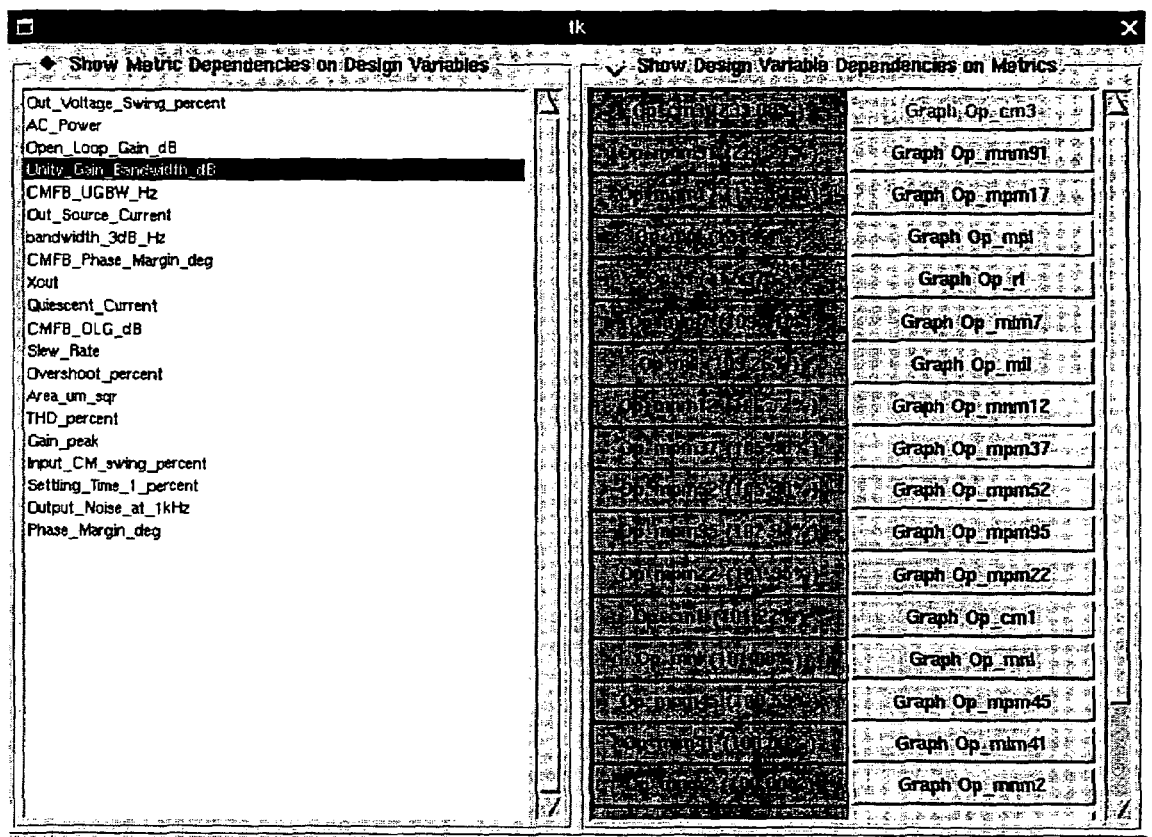
Figure 14:
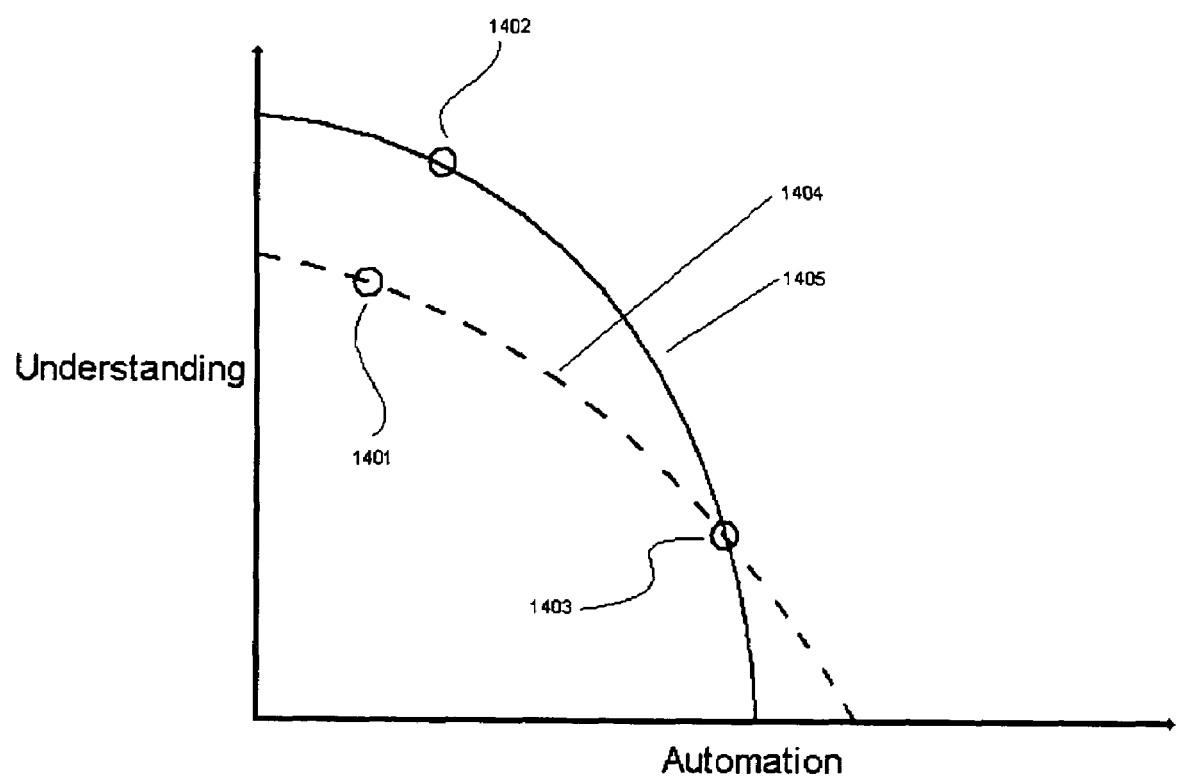
FIG. 14 illustrates the understanding provided by the present invention compared with a prior art method.
Figure 15:
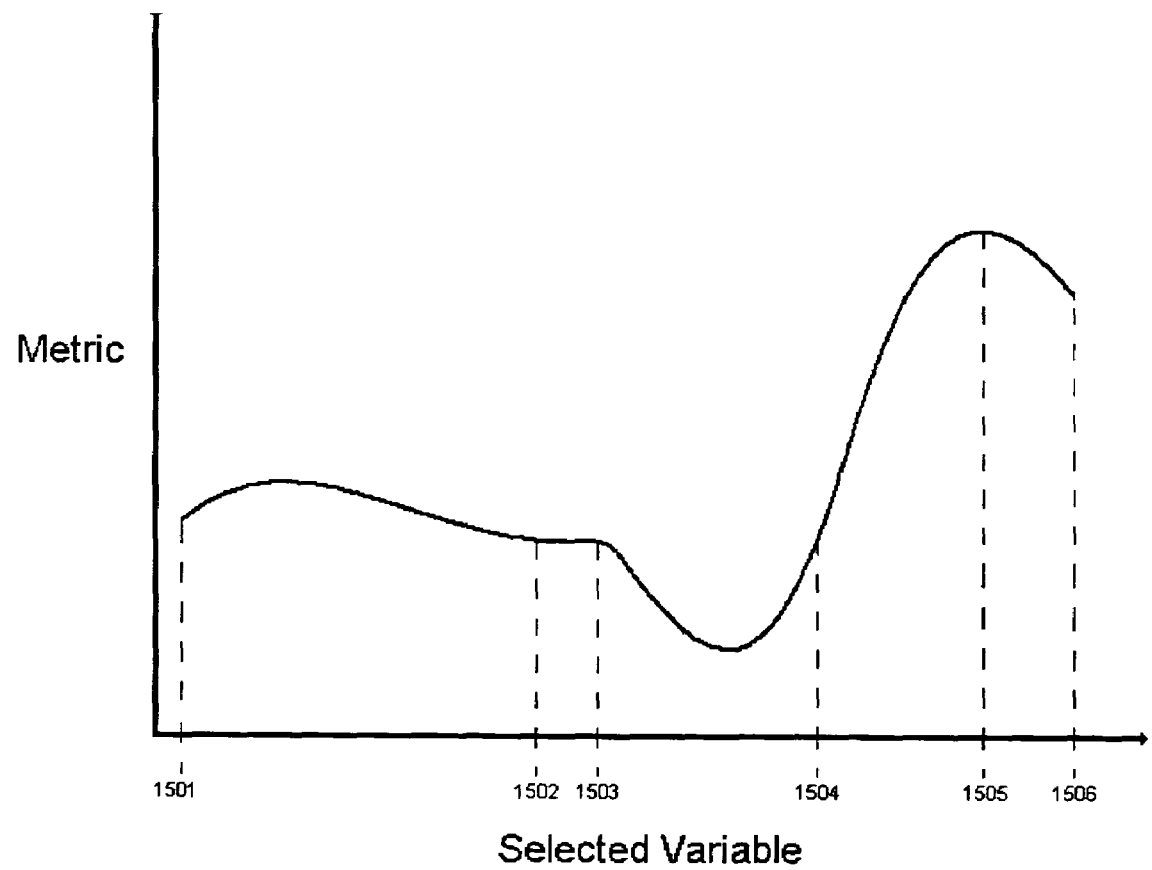
FIG. 15 illustrates sweeping of a selected variable.

FIG. 13 shows the result screen with the metric Unity_Gain_Bandwith_3 dB chosen to be improved. The design variables are sorted by amount of improvement. FIG. 12 shows the graph for best improver design variable Op_cm3. The three metrics 1201, 1202 and 1203 correspond with lines 1211, 1212 and 1213.

Figure 5:
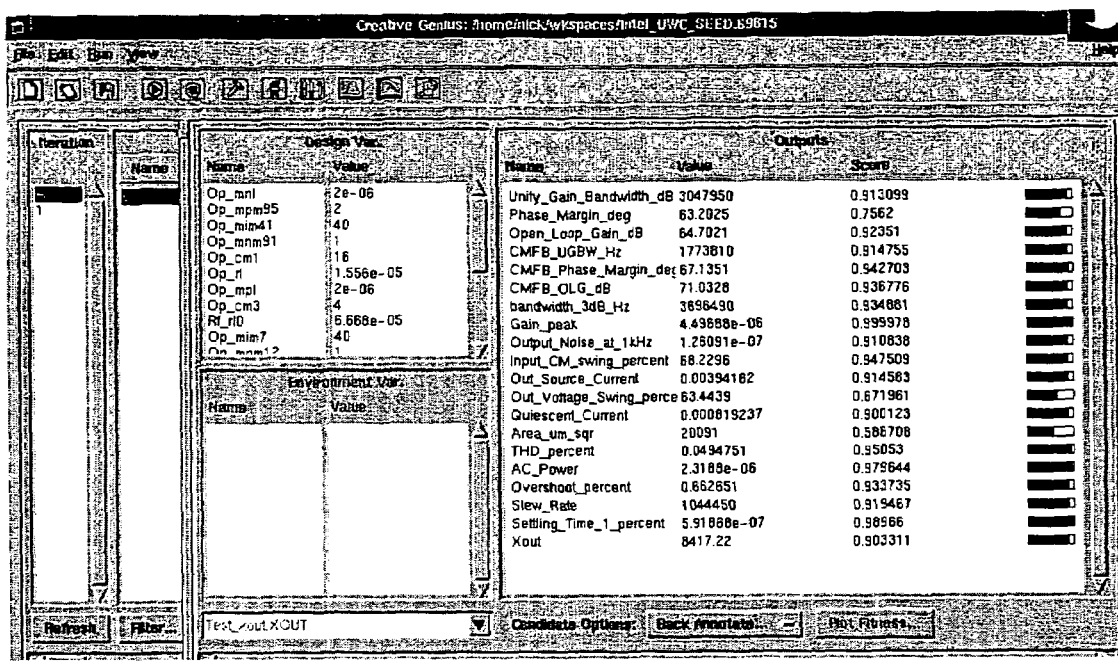
Figure 6:
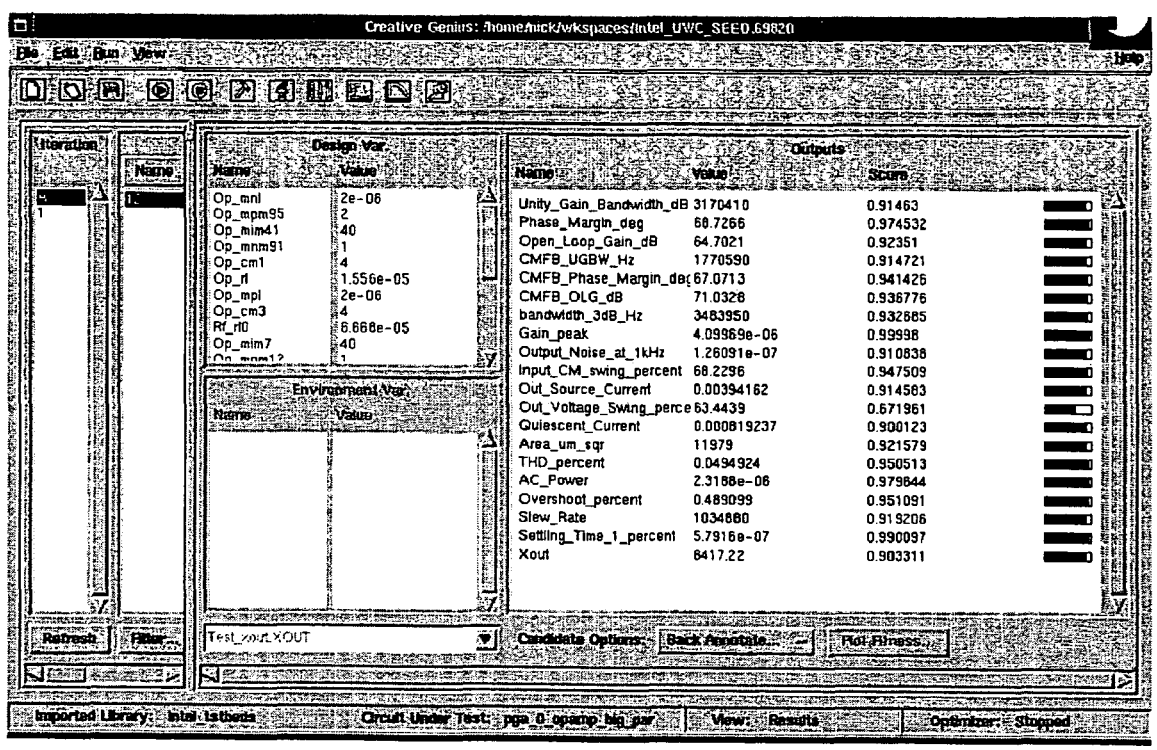

FIG. 5 shows analysis results for the same op amp after the 3 design variables have been changed to optimal values. Values have been chosen after looking through graphs FIGS. 10 to 12. There is a huge improvement of the important metrics discussed above. FIG. 6 shows the result after next step of improvement.

According to another aspect of the present invention, there is provided an enhanced method of design illustrated by a one dimensional semi-automatic approach.

Some design parameters have more effect on performance than others. We use this insight to improve upon the method given, in a few different ways. First, when the designer is interactively choosing which plots to examine, we can provide means for the designer to quickly find out which design parameters have the biggest effect. For example, we can provide a list of the design parameters, with the list sorted according to how much overall effect on performances they have. Alternatively, the designer can sort the list according to effect on a given performance. Another way to leverage this insight is to limit subsequent sampling by sweeping only over those design variables which have a significant effect on performance characteristics and not sweeping across design variables that have little or no effect on performance characteristics.

Some performances are affected more than others. We can use this insight to improve upon the method given. For example, we can provide means to quickly find out which performance characteristics are affected the most by any given design variables. Alternatively, we can provide means to quickly find out which performance characteristics are affected the most by a given design parameter, selected by the designer. Another way to leverage this insight is to limit subsequent sampling—not evaluating at performances that are not affected anyway.

This invention has uses in areas other than front end analog design as well, which we now describe. In general, this is applicable to any design problem in which design parameters can be related to performance characteristics. There can be designables in the design problem other than the design parameters (e.g. structures), but those would be handled by the designer. This is analogous to the case of analog topology design in which the designer handles changes to the topology itself based on the designer's understanding of the circuit, and the sampling takes place on the devices' possible parameter values. In essence, this invention is applicable in at least some way in most engineering fields and related disciplines.

This invention has application to back end analog design because the design problem can be set up such that some of the sub-steps of back end analog design have design parameters. For example, in placement, the x and y components of each device's location can be two design parameters.

This invention has application to transistor-precision digital circuit design, because a subset of that design problem can be transformed into an analog design problem. Then there are corresponding front-end and back-end design problems.

Other fields where this invention has application include, but are not limited to: design of mechanical systems (e.g. parts of an automobile engine), design of civil engineering structures (e.g. bridges, trusses, roads), design of MEMs systems, financial engineering (e.g. allocation of stocks to a portfolio), design of systems with computational intelligence structures (e.g. neural networks, fuzzy systems), design of networks, design of schedules, design of optical structures, design of sensors, design of biological structures, and industrial design (e.g. design of chairs, lamps).

The previous discussion has been framed in the context of one dimensional examples. However, analogous methods based on two dimensional and higher dimensional sampling are fully contemplated under the method of the present invention as natural extensions based on the techniques of the one-dimensional examples described above.

We can extend the "one dimensional sweep semi-automated method" to "two dimensional" to gain useful benefits. This extension is applicable to two design variables that do turn out to be coupled for some performance characteristics, or for the designer to visually understand how closely two design variables are coupled. As previously stated, the one dimensional method includes the following steps: sampling, followed by a loop of visualization and design value selection; and repeat as necessary.

These same core steps can get used for a two dimensional approach, though of course the implementation will be slightly different for two dimensions. The method can, for example follow the steps of FIG. 1 or 2. This two dimensional method can be used as a complement to the one dimensional method or on its own. A re-examination of FIGS. 1 and 2 shows that the basic steps still hold, keeping in mind that the implementation of sampling, visualization, and selection are different.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A method of interactively optimizing an engineering design, the method comprising:
    assigning a baseline set of design values to a set of design variables for the engineering design;
    conducting a sensitivity analysis on the engineering design to determine a set of performance factors, wherein each performance factor defines an effect, on a set of metrics for the engineering design, of variations in a selected design variable over a range of values, while holding the set of design variables, except for the selected design variable, at the baseline set of design values; and
    manually changing one or more of the baseline set of design values based on the set of performance factors to generate an updated set of design values for the set of design variables.

2. The method of claim 1, further comprising:
    conducting a simulation of the engineering design based on the updated set of design values to determine an output set of values for the set of metrics; and
    evaluating the output set of values to determine whether the updated set of design values allows the engineering design to satisfy a performance criterion.

3. The method of claim 2, further comprising:
    manually changing one or more of the revised set of design values based on the set of effects if the output set of values does not allow the engineering design to satisfy the performance criterion, and if the set of performance factors is determined to remain accurate for the updated set of design values.

4. The method of claim 2, further comprising:
    applying a structural change to the engineering design to generate an updated engineering design if the output set of values does not allow the engineering design to satisfy the performance criterion, and if the set of performance factors is determined to not remain accurate for the updated set of design values; and
    performing, on the updated engineering design, the steps of assigning the baseline set of design values, conducting the sensitivity analysis, manually changing one or more of the baseline set of design values, performing the simulation, and evaluating the output set of values.

5. The method of claim 1, wherein conducting the sensitivity analysis comprises visually presenting the set of performance factors to a designer for review.

6. The method of claim 1, wherein conducting the sensitivity analysis comprises:
    selecting one or more of the design variables;
    selecting a simulation range for each of the one or more design variables;
    selecting one of the one or more design variables;
    performing a set of simulations on the engineering design using the baseline set of design values and varying the one of the one or more design variables over the simulation range for the one of the one or more design variables to generate a test set of values for the set of metrics;
    generating a set of test results for the one of the one or more design variables by associating the test set of values with the simulation range for the one of the one or more design variables;
    repeating the steps of selecting the one of the one or more design variables, performing the set of simulations, and generating the set of test results for each of the one or more design variables; and
    compiling the set of test results for each of the one or more design variables into the set of performance factors.

7. A system for interactively optimizing an engineering design, the system comprising:
    storage means for associating a baseline set of design values for a set of design variables for the engineering design;
    computing means for performing a sensitivity analysis on the engineering design to determine a set of performance factors, wherein each performance factor defines an effect, on metrics for the engineering design, of variations in a selected design variable over a range of values, while holding the set of design variables, except for the selected design variable, at the baseline set of design values;
    display means for visually displaying the set of performance factors; and
    means for allowing a user to select and change one or more of the baseline set of design values based on the set of performance factors.

8. The system of claim 7, further comprising means for allowing the user to apply a structural change to the engineering design.

9. A software tool for controlling a computing system, the software tool comprising:
    instructions for causing the computing system to store a baseline set of design values for a set of design variables for an engineering design;
    instructions for causing the computing system to perform a sensitivity analysis on the engineering design to determine a set of performance factors, wherein each performance factor defines an effect, on a set of metrics for the engineering design, of variations in a selected design variable over a range of values, while holding the set of design variables, except for the selected design variable, at the baseline set of design values;

instructions for causing the computing system to graphically display the set of performance factors for a user; and instructions for causing the computing system to adjust one or more of the baseline set of design values to generate an updated set of design values for the set of design variables in response to an input from the user.

10. The software tool of claim 9, further comprising instructions for causing the computing system to perform a simulation of the engineering design using the updated set of design values to determine an output set of values for the set of metrics.

11. The software tool of claim 10, further comprising instructions for applying a structural change to the engineering design.

* * * * *